(12) United States Patent
Winkler

(10) Patent No.: US 7,737,885 B2
(45) Date of Patent: Jun. 15, 2010

(54) RAMP LINEARIZATION FOR FMCW RADAR USING DIGITAL DOWN-CONVERSION OF A SAMPLED VCO SIGNAL

(75) Inventor: Volker Winkler, Brunnen (DE)

(73) Assignee: Infineon Technologies AG, Neubiberg (DE)

( * ) Notice: Subject to any disclaimer, the term of this patent is extended or adjusted under 35 U.S.C. 154(b) by 169 days.

(21) Appl. No.: 11/832,315

(22) Filed: Aug. 1, 2007

(65) Prior Publication Data
US 2009/0033538 A1 Feb. 5, 2009

(51) Int. Cl.
*G01S 7/35* (2006.01)
*G01S 7/40* (2006.01)
*G01S 13/34* (2006.01)

(52) U.S. Cl. .................. 342/195; 342/100; 342/128; 342/173; 342/200

(58) Field of Classification Search ............... 342/128, 342/200, 165, 173, 195, 98–103
See application file for complete search history.

(56) References Cited

U.S. PATENT DOCUMENTS

| | | | |
|---|---|---|---|
| 4,321,549 A * | 3/1982 | Hansen | 329/361 |
| 4,754,277 A | 6/1988 | Voyce | |
| 5,189,427 A | 2/1993 | Stove et al. | |
| 6,252,464 B1 * | 6/2001 | Richards et al. | 331/4 |
| 7,221,309 B2 | 5/2007 | Isaji | |
| 7,508,281 B2 * | 3/2009 | Kobata | 331/182 |

OTHER PUBLICATIONS

Christmann, M., et al., "SAW based Delay Locked Loop concept for VCO linearization in FMCW Radar sensors," 33$^{rd}$ European Microwave Conference, 2003, Munich, Germany, pp. 1135-1138.
Fuchs, J., et al., "Simple Techniques to Correct for VCO Nonlinearities in Short Range FMCW Radars," IEEE MTT-S Digest, 1996, pp. 1175-1178.

* cited by examiner

*Primary Examiner*—Thomas H Tarcza
*Assistant Examiner*—Cassi Galt
(74) *Attorney, Agent, or Firm*—Slater & Matsil, L.L.P.

(57) ABSTRACT

The invention relates to an FMCW radar system and a method of operating an FMCW radar system to produce a linear frequency ramp. The FMCW radar system includes a VCO, a frequency divider coupled to the VCO output, followed by an A/D converter. A down-converter shifts the digitally converted signal to baseband samples, followed by a low-pass filter coupled to an output thereof. A VCO frequency estimator produces instantaneous VCO frequency estimates from phase differences determined from the filtered baseband samples. A D/A converter coupled to an output of the VCO frequency estimator produces an input signal for the VCO to produce therewith a linear VCO frequency ramp. A Δ-Σ modulator is coupled between the VCO frequency estimator and the input of the D/A converter to produce a dithered VCO control signal, thereby increasing the effective number of bits of the D/A converter.

28 Claims, 9 Drawing Sheets

RAMP LINEARIZATION FOR FMCW RADAR USING DIGITAL DOWN-CONVERSION OF A SAMPLED VCO SIGNAL

TECHNICAL FIELD

An embodiment of the invention generally relates to FMCW ("frequency modulated continuous wave") radar, a process for producing a linearly ramped frequency for an FMCW radar, and a related method.

BACKGROUND

Since their early development, radar systems have detected and measured the distance to objects lying in their beams by transmitting high-power pulsed waveforms. An alternative way for measuring the distance to a reflecting object is the FMCW radar principle, which is based on continuous wave frequency chirps. For automotive radar systems this principle is very common because a high dynamic range can be achieved with respect to the frequency regulations and available MMICs (Monolithic Microwave Integrated Circuits).

FMCW radars operate by generating a continuous, i.e., not pulsed, transmitted signal using an oscillator that produces a linear frequency ramp. Thus, FMCW radars are also "chirped." The linear frequency ramp is periodically generated, generally with a rapid linear transition from an end frequency to the initial frequency, i.e., the frequency ramp is produced with a sawtooth waveform. An object with sufficient radar cross-section lying within a beam of an FMCW radar antenna reflects a signal that is received by the radar system after a time delay proportional to the distance between the radar antenna and the reflecting object. In view of the substantially constant and known waveform propagation speed in a typical radar application, such distance measurements can potentially be made very accurately.

An FMCW distance measurement relies on the instantaneous frequency of the reflected signal being displaced from the instantaneous transmitted signal by a constant frequency difference dependent on the object's distance. Such constant frequency difference between transmitted and received signals relies on the linearity of the frequency ramp produced by the radar's oscillator. By multiplying a signal representing the transmitted signal by a signal representing the received signal, a waveform with a beat frequency is produced with a frequency proportional to the distance between the radar antenna and the reflecting object, with a small correction to account for Doppler shift resulting from the speed of the object relative to the radar antenna. By sampling the beat frequency waveform and estimating the beat frequency, a distance estimate can be produced.

VCOs ("voltage-controlled oscillators") can produce an output signal with a frequency that is roughly linearly dependent on an input control signal. The lack of perfect linearity in the frequency control process corrupts the distance estimate. Two areas of concern arise: The first is the deviation of the estimated object distance from proportionality to the beat frequency of the multiplied signals. The second is the multiplicity of beat frequency components produced by nonlinearity of the VCO control process, which can potentially produce multiple object images for a single reflecting object.

A known technique for generating a periodic VCO control signal that produces a perfect VCO frequency ramp is to measure the deviation of VCO frequency from a perfect frequency ramp, and adjust the periodic VCO control signal for the next transmit cycle accordingly. Although this technique is simple in principle, its execution in the prior art has resulted in inaccurate ramp generation and/or complex and expensive circuit designs.

Thus, a challenge in designing an FMCW radar to generate a unique and accurate distance measurement for a reflecting object is generating a periodic control signal for a VCO to produce an output signal with a periodic, linear frequency ramp, wherein the VCO control signal is compensated for nonlinearities of the VCO.

SUMMARY OF THE INVENTION

In accordance with one exemplary embodiment of the invention, an FMCW radar system is provided. The FMCW radar system includes a VCO that is controlled to produce an output frequency with a linear, periodic frequency ramp. The FMCW radar system further includes a frequency divider coupled to an output of the VCO to produce a frequency-divided VCO output signal, and an A/D ("analog-to-digital") converter coupled to the frequency-divided VCO output signal. The frequency-divided VCO output signal is undersampled and down-converted to baseband frequencies. A VCO frequency estimator estimates VCO frequencies therefrom. In an advantageous embodiment, a $\Delta$-$\Sigma$ modulator dithers the estimated VCO frequencies, the output of which is converted by a D/A converter to produce a control signal for the VCO. In a further advantageous embodiment, an extrapolator coupled to the VCO frequency estimator produces frequency estimates of start and end-point ramp frequencies of the VCO.

BRIEF DESCRIPTION OF THE DRAWINGS

In the figures, identical reference symbols generally designate the same component parts throughout the various views. In the description below, various exemplary embodiments of the invention are described with reference to the following drawings, in which.

DETAILED DESCRIPTION OF ILLUSTRATIVE EMBODIMENTS

Figure 1:
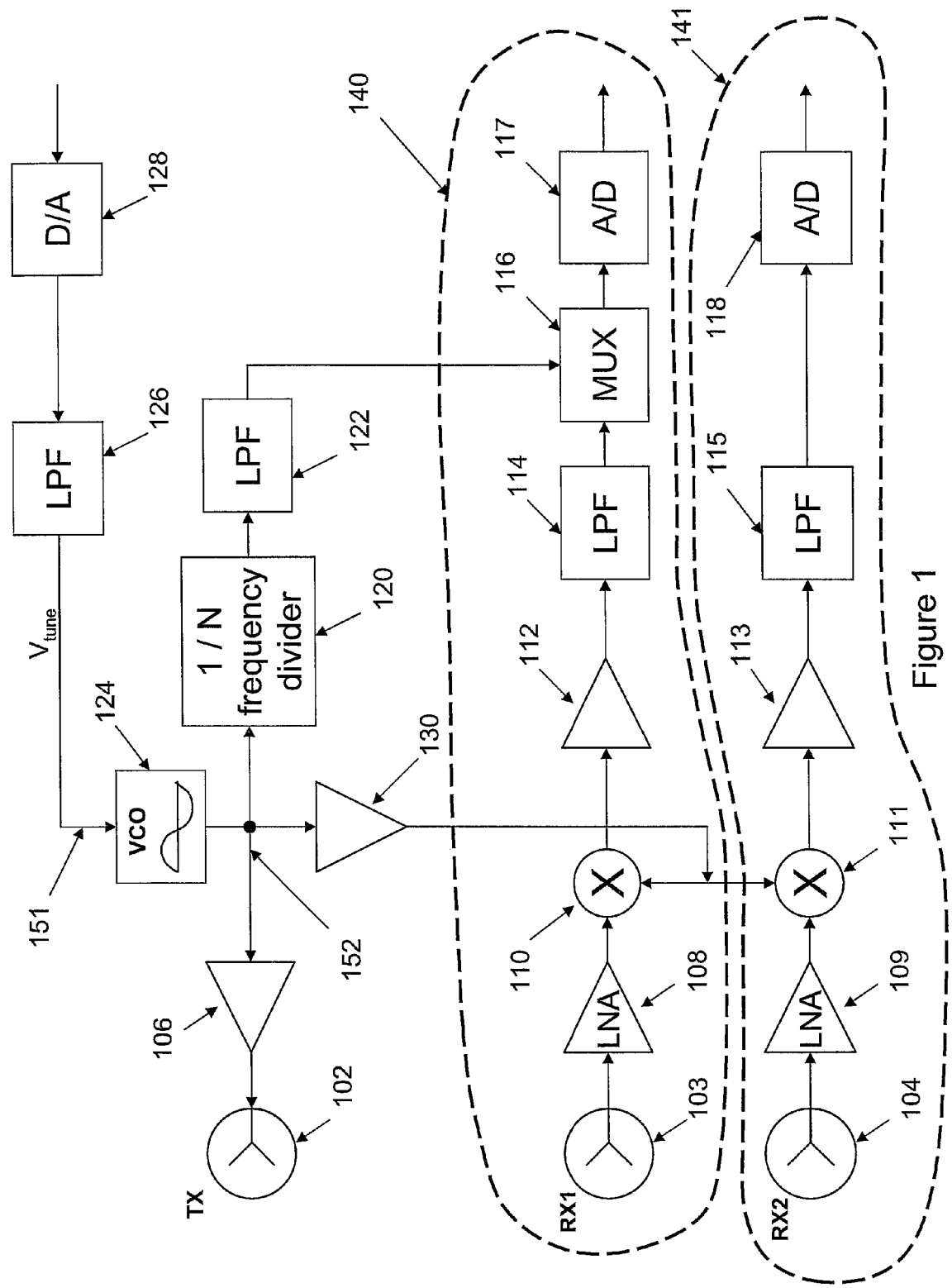
FIGS. 1 and 2 illustrate a block diagram of an exemplary FMCW radar system, constructed according to the principles of the invention.

Ramping of an FMCW radar transmitter frequency should be performed as linearly as possible for the radar to operate optimally over a wide dynamic range of object distances and object sizes. In an advantageous embodiment of the invention, a frequency-modulated carrier is produced by a frequency generator comprising a VCO that produces a linearly ramped, frequency-modulated carrier. The frequency generator includes a D/A ("digital-to-analog") converter to produce a nonlinear, frequency-controlling, input ramp signal for the VCO, with amplification and low-pass filtering of the input ramp signal as necessary. In the process of performing the D/A conversion, the instantaneous ramping frequency of the VCO, whose frequency is to be controlled, can be determined. The VCO output signal is undersampled with an A/D converter that is preferably already present in the system for sampling another signal, which is normally the case for the IF ("intermediate frequency") signal. As a result, the only additional expense for sampling the instantaneous VCO frequency can be that of a multiplexer that alternately samples the VCO output signal and the other signal. In an advantageous embodiment, relatively simple signal processing of the instantaneous VCO frequency can be performed during generation of the VCO input ramp. Generation of the nonlinear frequency-controlling VCO input ramp for the next frequency-modulating cycle uses a corrected output from the D/A converter. Quantization effects in the D/A converter output signal that controls the VCO, however, can impair the resulting VCO output signal quality. In an advantageous embodiment, a delta-sigma modulator ("$\Delta$-$\Sigma$ modulator") produces an input signal for the D/A converter, whose output is fed to a low-pass filter to reduce the effects of quantization. The usage of the delta-sigma modulator relaxes the requirements on the transfer function of the low-pass filter.

The generation of a nonlinear VCO frequency-control input ramp to control the VCO frequency ramp speed has been performed in the past with PLLs ("phase-lock loops"), which can be quite complex in their implementation. In an advantageous embodiment of the invention, the direct production of a frequency ramp uses a D/A converter in conjunction with other circuit elements to measure an instantaneous VCO frequency. The measurement of instantaneous VCO frequency is further improved in an embodiment of the invention with a $\Delta$-$\Sigma$ modulator to generate a dithered D/A converter input signal.

A static frequency measurement implies the need to generate a certain D/A value in the process of measuring a constant frequency. A static VCO frequency measurement as performed in the past ordinarily requires a relatively long period of time for its execution, and must be executed in a particular time slot. In addition, it should be able to respond to the expected range of VCO frequency deviations. Other procedures that have been used in the past that operate without undersampling the VCO output signal require a high scanning rate, work at high frequencies, or cannot measure an instantaneous frequency within a ramp. Moreover, complex hardware such as a delay line, e.g., a SAW ("surface acoustic wave") element, has been employed in the past for an instantaneous VCO frequency measurement with its attendant cost.

In an advantageous embodiment of the invention, the instantaneous frequency of a VCO controlled to produce a linear frequency ramp is determined by undersampling a frequency-divided VCO output signal at a sampling rate lower than the fundamental frequency of the frequency-divided VCO frequency with an A/D converter after low-pass filtering. A RAM ("random access memory") stores interpolated and corrected D/A converter values. A $\Delta$-$\Sigma$ modulator is employed to improve the effects of quantization in the VCO frequency-control process. An A/D converter that is already present in the system can be re-used for this process by employing a multiplexer to sample multiple signals. An instantaneous frequency within a VCO frequency ramping range is thus determined without the need for special or expensive hardware. The signal-processing unit for the computation of instantaneous VCO frequency is relatively simple, and can be operated at a low clock frequency.

While the VCO frequency ramp is being generated, a frequency-divided VCO signal is undersampled over time. Firstly the mean value of the divider signal is subtracted. For calculating a complex baseband signal after the frequency down-conversion process, the sampled signal is shifted in frequency, and mirrored spectra are suppressed by digital filtering. Each sample of a finally obtained complex baseband signal is multiplied by its complex conjugate predecessor to calculate the phase of the resulting value. This is done in order to calculate the phase difference between two successive samples.

This phase difference is a measure for the frequency of the undersampled divider signal. The calculated frequency is directly related to the instantaneous VCO frequency by the divider factor and the undersampling ratio. Since an FIR ("finite impulse response") filter employed therewith, as described later hereinbelow, has an inherent response time, the instantaneous frequency at or near the beginning and end of the VCO frequency ramp cannot be accurately computed. End-point frequencies can be computed relatively simply and accurately, nonetheless, using extrapolation from frequencies in a middle VCO frequency range. An alternative way to overcome this problem is to start the sampling before the ramp start and to continue sampling after the ramp end according to the FIR filter length. With these considerations, and without limitation, the computation of a sequence of instantaneous VCO frequencies from D/A converted sample values is performed with equally spaced ("equidistant") frequencies. To obtain an instantaneous VCO frequency at any point during a frequency ramp, interpolation is performed on values stored in RAM.

A D/A converter is used to generate the nonlinear analog signal that controls the frequency of the VCO. Digital input values for the D/A converter are computed with L bits more than the number of bits used in the D/A converter itself. The L LSBs ("least significant bits") are processed in a $\Delta$-$\Sigma$ modulator, and the MSBs ("most significant bits") are added to the output of the $\Delta$-$\Sigma$ modulator. At the output of the D/A converter is a low-pass filter, whose output is connected to the frequency-control input of the VCO. In this manner, quantization effects of the D/A converter can be compensated, because the subsequent low-pass filter produces a smoothed output signal. The filtered signal allows an accurate nonlinear frequency-controlling input signal for the VCO.

In an exemplary embodiment, the D/A converter operates with 10 input bits. Twelve bits are computed in the preceding digital process. The $\Delta$-$\Sigma$ modulator processes the extra two LSBs. The sum of the output of $\Delta$-$\Sigma$ modulator and the 10 MSBs of the process are fed to the D/A converter. By increasing the clock frequency, the requirements on the transfer function of the low-pass filter can be relaxed, which is more appropriate for on-chip integration. This allows one to save off-chip components for the low-pass filter.

Turning now to FIG. 1, a circuit diagram of a portion of an exemplary FMCW radar system is illustrated, constructed according to the principles of the invention. VCO 124 produces an output signal 152, ideally with a linear frequency ramp. VCO 124 is controlled by nonlinear input signal 151, produced by D/A converter 128, and filtered by low-pass filter 126. VCO output signal 152 is amplified by power amplifier 106 and radiated by radar transmitter antenna 102. In an exemplary radar system, VCO 124 produces an output signal with a linear frequency ramp from 24 to 24.8 GHz.

Two receiving channels are included in the radar system. Receiving channel 140 is advantageously configured with a feedback process to adjust the input signal to VCO 124 to produce a linear frequency ramp. A reflected signal is received from an object by antenna 103, which is amplified by low-noise amplifier 108. The amplified signal is down-converted in frequency by mixer 110, which includes an input signal from VCO 124 amplified by amplifier 130. The down-converted signal is amplified by amplifier 112 and filtered by low-pass filter 114. The filtered output of low-pass filter 114 is converted into a digital format by A/D converter 117 after selection by multiplexer 116.

To construct a process to correct the ramp-control input signal 151, to VCO 124, the output signal 152 from VCO 124 is divided down in frequency by a factor N by frequency divider 120. The output of frequency divider 120 is then filtered by low-pass filter 122, and after sampling by multiplexer 116, is converted into digital format by A/D converter 117. Frequency divider 120 can be readily constructed using techniques well known in the art with digital circuit elements such as flip-flops and/or a digital counter. In the exemplary radar system, the factor N is 5120, and the useful portion of the signal produced at the output of low-pass filter 122 spans the approximate frequency range of 4.68 to 4.84 MHz.

A second receiving channel, receiving channel 141, includes antenna 104, low noise amplifier 109, mixer 111, amplifier 113, low-pass filter 115, and A/D converter 118, which operates in ways corresponding to similar elements in receiving channel 140. The second receiving channel is typically included to provide an angle-of-incidence measurement for the object, which is performed using a phase monopulse process that operates on the difference between the two receiving channels, as is well known in the art. The phase difference between the two receive channels can be used to calculate the angle of incidence of detected objects at a certain distance. The second receiving channel need not be used in the feedback process to generate the nonlinear frequency-controlling input signal for the VCO.

In an FMCW radar system, advantageously constructed according to the principles of the invention, a radar signal is thus generated with a substantially linear frequency ramp, amplified to an appropriate power level, and radiated from a transmitting antenna. An object lying in the radiation pattern of the radar scatters the radiated signal back, where it is received and down-mixed with the VCO signal to produce baseband frequencies. A frequency difference resulting from the roundtrip propagation time of the radiated signal is used to produce a distance estimate for the object, the estimated distance being proportional to the frequency difference between the linearly ramped transmitted and received signals. The distance estimate can be Doppler-corrected for known or estimated velocity of the object relative to the radar. The baseband signal, which is ideally sinusoidal, is then amplified and sampled.

In order to measure instantaneous frequency during ramp generation, the VCO signal is divided down in frequency as described above by the factor N, preferably with an integrated divider. Using a multiplexer, one A/D converter is sufficient, as illustrated in FIG. 1, to sample both the received baseband signal after down-conversion, e.g., from low-pass filter 114, and the divided VCO signal, e.g. from low-pass filter 122. Before sampling, analog low-pass filter 114 is included to produce a substantially sinusoidal signal from the divided-down signal from the digital circuitry, which ordinarily produces a square-wave signal. Undersampling implies that the sampling frequency $f_a = 1/T_a$ of the VCO output signal is smaller than the central frequency of the passband, where $T_a$ is the sampling interval, e.g., 1/1.25 MHz in the exemplary radar system. The frequency range of the wanted signal in this case spans the minimum and maximum VCO tuning frequencies divided by the factor N. e.g., the frequency range from 4.68 to 4.84 MHz in the exemplary radar system. In the exemplary radar system, it thus has a bandwidth of only a few hundred kilohertz. The central frequency $f_m$ of the VCO passband is:

$$f_m = f_{min} + (f_{max} - f_{min})/2,$$

where $f_{max}$ and $f_{min}$ are the maximum and minimum VCO frequencies, respectively, e.g., $f_m = 24.4$ GHz in the exemplary radar system. After the sampling, the band of wanted frequencies is centered about the frequency $f_c$. The frequency $f_c$ is computed using the formula:

$$f_c = \mathrm{rem}(f_m/f_a),$$

where "rem" is the "remainder" function representing the non-integer remainder after division, e.g., $f_c = \mathrm{rem}(24.4\ \mathrm{GHz}/5120/1.25\ \mathrm{MHz}) = 1.0156$ MHz in the exemplary radar system.

Figure 2:
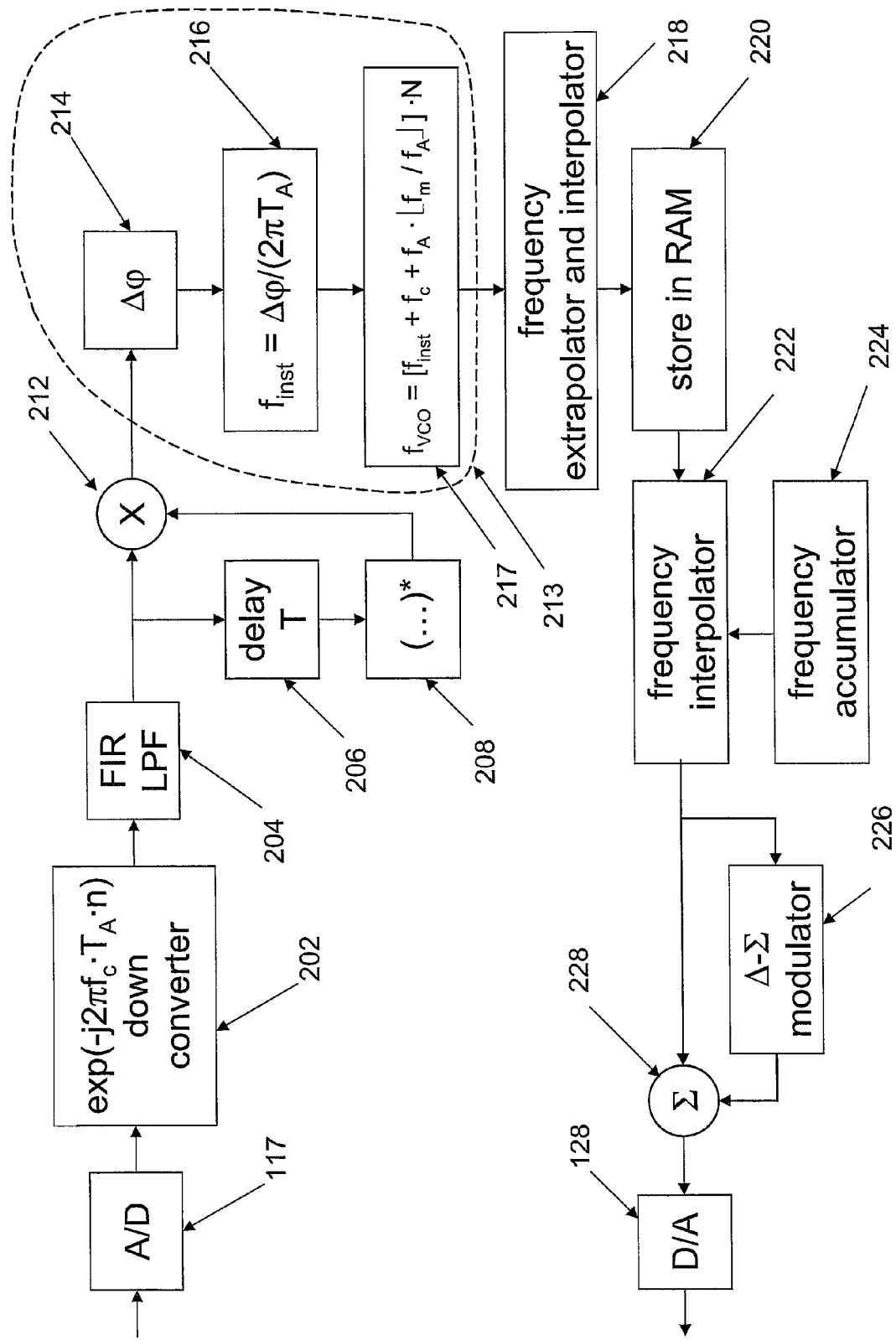
Figure 3:
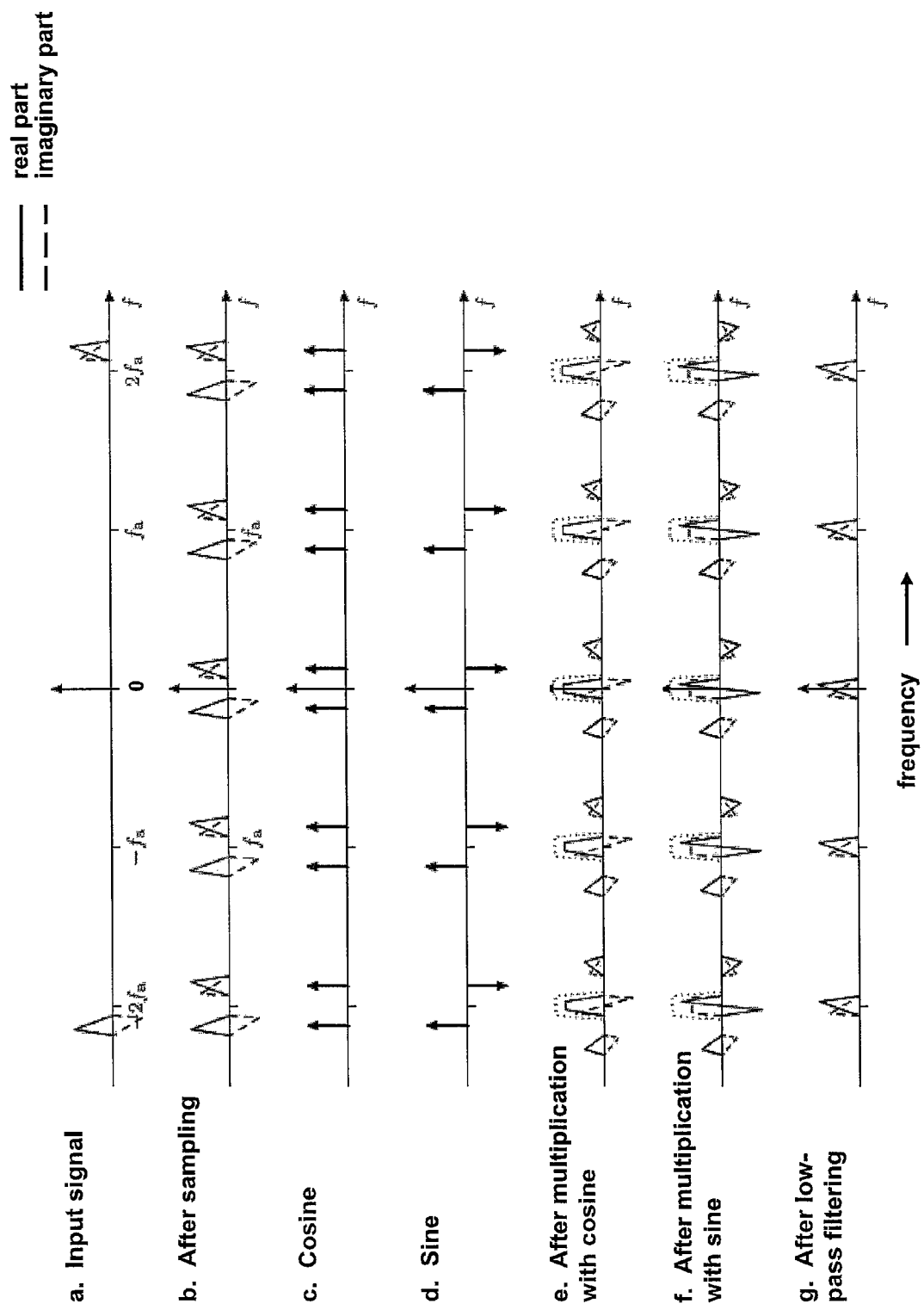
FIG. 3 illustrates signal spectra of waveforms produced in a process to generate a VCO input signal, the waveforms produced according to the principles of the invention.

The principle of digital down-conversion and undersampling is further illustrated in FIGS. 2 and 3, in an advantageous embodiment of the invention. The A/D converter 117 and the D/A converter 128 that were illustrated and described with reference to FIG. 1 are shown again for clarity in FIG. 2, which is a continuation of the drawing illustrated in FIG. 1. The first step of the down-conversion process is to shift the wanted frequency band from around the frequency $f_c$ to baseband. This is performed in block 202 in FIG. 2 by multiplication with the following expression:

$$\exp(-j2\pi \cdot f_c \cdot T_a \cdot n)$$

In the expression above, $T_a$ is the sampling interval, and n is the sample position. This multiplication can be implemented in digital logic using, for example, the CORDIC algorithm ("COordinate Rotation in a DIgital Computer," a class of shift-add algorithms for rotating vectors in a plane), which is a process well known in the art. After multiplication in block 202, the result is filtered by FIR filter 204 to suppress the resulting mirror spectra. In an exemplary radar system design the following coefficients were used for the FIR filter: 1, 6, 21, 56, 120, 216, 336, 456, 546, 580, 546, 456, 336, 216, 120, 56, 21, 6, and 1. These coefficients are derived from the following transfer function with R=4 and M=6:

$$H(z) = \left[ \sum_{k=0}^{R} z^{-k} \right]^M$$

This transfer function was used in an exemplary system because the filter length is short and a zero transition can be produced at the mirrored spectra; of course any transfer function could be used that provides sufficient suppression of the mirrored spectra.

Turning now to graph "a" of FIG. 3, the analog input signal to A/D converter 117 is illustrated, i.e., the signal produced after down-conversion in block 120 and filtering by the low-pass filter in block 122, but before sampling in block 117. In graph "b" of FIG. 3, the signal after A/D conversion is illustrated, which illustrates the generation of mirrored spectra due to sampling at the frequency $f_a$. In graphs "c" and "d" are shown the real and imaginary part of the expression $$\exp(-j2\pi f_c \cdot T_A \cdot n) = \cos(2\pi f_c \cdot T_A \cdot n) - i \cdot \sin(2\pi f_c \cdot T_A \cdot n),$$

and in graphs "e" and "f", the signal is shown after multiplication with the sine and cosine components, respectively. Because the signals are sampled, the spectra are repeated according to the sampling frequency. Graph "g" illustrates the result after multiplication in block 202 and filtering by FIR filter 204 (illustrated in FIG. 2) to suppress the mirrored spectra to yield the complex baseband signal.

The complex baseband signal is used for calculating the instantaneous VCO frequency. After filtering by FIR filter 204, each filtered sample is multiplied in block 212 by the value of its complex conjugate predecessor produced in block 208, employing one-sampling-cycle delay element 206 to give the value of the previous sample. The phase increment $\Delta\phi$ of the current sample with respect to the previous sample is determined in block 214 by computing the phase angle $\Delta\phi$ between the current sample and the predecessor sample using a complex dot product to generate the cosine of the angle between the two samples, as described previously hereinabove. This phase calculation can also be implemented using the CORDIC algorithm.

The instantaneous frequency $f_{inst}$ of the undersampled and divided VCO signal is finally computed in frequency increment estimator block 216 using the equation $$f_{inst} = \Delta\phi / (2\pi T_A).$$

The calculation of the instantaneous VCO frequency from $f_{inst}$ is then performed in block 217 using the equation:

$$f_{VCO} = [f_{inst} + f_c + f_A \cdot \lfloor f_m / f_A \rfloor] \cdot N$$

where the notation "$\lfloor f_m / f_A \rfloor$" represents rounding to the floor. Thus, blocks 214, 216, and 217 perform calculation for VCO frequency estimation, and are illustrated collectively as VCO frequency estimator 213 in FIG. 2.

Since FIR filter 204 necessarily operates with a certain sample length and response time, instantaneous VCO frequencies at and near the beginning and end of the ramp cannot be determined in the steps described above. Accordingly, an extrapolation is used in block 218 to determine these end-point VCO frequency values. For example, if VCO frequency is determined at 512 sample points, roughly the first and last 30 sample points must be determined by extrapolation. An alternative process within the scope of the invention to avoid extrapolation is to start the sampling process before ramp generation, and to continue sampling after ramp generation to accommodate the length (number of sample points) of the FIR filter.

The instantaneous VCO frequency values thus determined are not stored directly into RAM represented by block 220, but the new D/A converter values are determined at equidistant frequencies $f_{RAM}(k)$ so that the minimum and maximum frequencies for a desired ramp generation are covered:

$$f_{RAM}(k) = f_{start} + k \cdot \Delta f \; k = 0, 1, \ldots, N_{RAM}$$

The frequency values $f_{RAM}(k)$ can be represented by unsigned integer values. The frequency increment $\Delta f$ in the equation above can be chosen in such a way that the desired frequency span is covered and the increment is represented as $2^p$, where p is an arbitrary integer value. This representation simplifies interpolation in block 222 during ramp generation. Before ramp generation can start, the D/A-converter values for the frequencies $f_{RAM}(k)$ must be interpolated using the instantaneous frequency $f_{inst}$ and the current D/A values stored in the RAM.

For generation of an actual frequency ramp, a frequency accumulator 224 is loaded with the ramp start frequency and a frequency increment. The accumulator represents the desired frequency over time that must be generated. Because the accumulator operates with a certain clock frequency, the frequency increment is chosen in such a way that the ramp has the desired duration. The accumulator produces a desired/target frequency $f_{soll}$. The frequencies $f_{RAM}$ lying adjacent to the desired target frequency $f_{soll}$ are used for interpolating the required D/A converter value in block 222. After calculating the frequency difference $f_{soll} - f_{start}$, it is sufficient to consider only the p MSBs ("most significant bits") to determine the position in the RAM for reading the necessary D/A values. After interpolation, the computed values could be fed to the D/A converter. However, in order to avoid quantization effects in the D/A converter, the procedure used in the interpolation process produces values with M+L bits, but the D/A converter operates with only M bits. The L least significant bits are coupled to the input of $\Delta$-$\Sigma$ modulator 226, and the M most significant bits are added to its output, illustrated in FIG. 2 as summer 228. Using a $\Delta$-$\Sigma$ modulator to produce a dithered input to D/A converter 128, which was illustrated and described previously in the top-right portion of FIG. 1, the requirement for the number of D/A converter bits can be reduced, as well as in the process representing the transfer function of the following low-pass filter, shown in FIG. 1 as low-pass filter 126.

If VCO frequency ramps with different slopes are used in the system, for example, to select different distance ranges for a sensed object, there is a corresponding advantage, since otherwise a low-pass filter for the slower ramps cannot be optimal.

Figure 4:
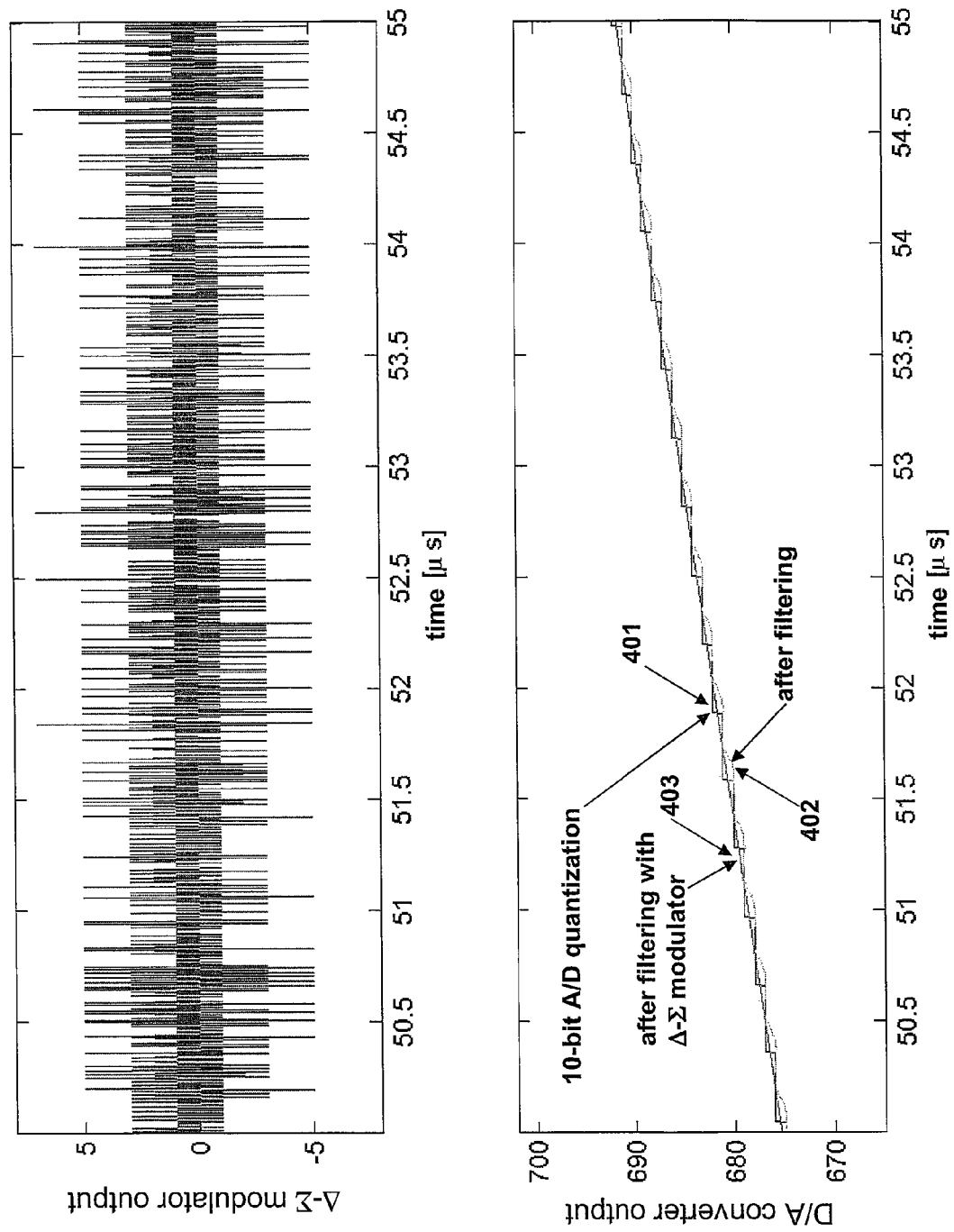
FIG. 4 illustrates a dithered $\Delta$-$\Sigma$ modulator output signal and a D/A converter output signal produced after various stages of signal processing, leading to a result produced according to the principles of the invention.

FIG. 4 illustrates the operation of a frequency ramp linearization process for a VCO including a $\Delta$-$\Sigma$ modulator, constructed in accordance with the principles of the invention. In the top graph of FIG. 4 are shown exemplary output values produced by a $\Delta$-$\Sigma$ modulator, which is, without limitation, a MASH third-order modulator ("multi-stage, noise shaping" modulator including three integrators), which are modulators well known in the art. The output of the $\Delta$-$\Sigma$ modulator appears as a high-frequency signal with "noise-like alternations" that is superimposed on the MSBs of the interpolator output. The following low-pass filter extracts a mean value from these noise-like alternations to reduce the effect of quantization in the A/D converter.

Multi-stage $\Delta$-$\Sigma$ modulators, i.e., multiple $\Delta$-$\Sigma$ modulators arranged in cascade, are frequently employed to reduce the potential for instability encountered with a high-order, single-stage modulator arrangement, and can contain an internal noise-shaping filter to shape the spectral noise characteristics of the modulator output signal. Internal noise shaping in the modulator can reduce filtering requirements of a following low-pass filter, such as low-pass filter 126.

The lower graph of FIG. 4 illustrates the effect of quantization with a 10-bit A/D converter as illustrated by trace 401. After low-pass filtering, i.e., by block 126, but without a $\Delta$-$\Sigma$-modulator, a relatively linear but wavy, filtered signal for the VCO input is produced due to discontinuities resulting from quantization in the output signal of the A/D converter, as illustrated by trace 402. With filtering and with a $\Delta$-$\Sigma$ modulator, the filtered output signal is almost ideally linear as a consequence of filtering a signal after processing with a Δ-Σ-modulator, as illustrated by trace 403.

Figure 5:
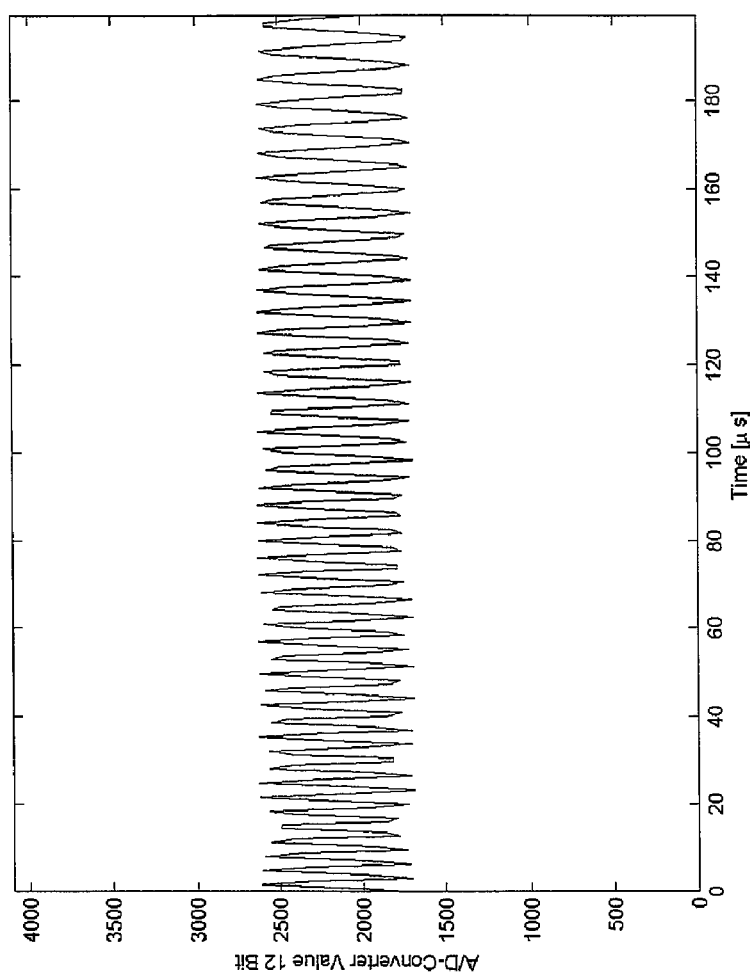
FIG. 5 illustrates an undersampled down-converted VCO output signal, produced according to the principles of the invention.

The entire process was realized for a 24 GHz prototype, employing a frequency ramp from 24 GHz to 24.8 GHz, with ramp duration of 200 μs. The VCO output frequency was divided by 5120, which leads to a down-converted VCO signal in the frequency range from 4.68 MHz to 4.84 MHz. This frequency-divided signal was undersampled at 1.25 MHz, and is illustrated in FIG. 5. This signal appears substantially sinusoidal with a frequency that is slowly decreasing from the left side to the right side of the graph.

Figure 6:
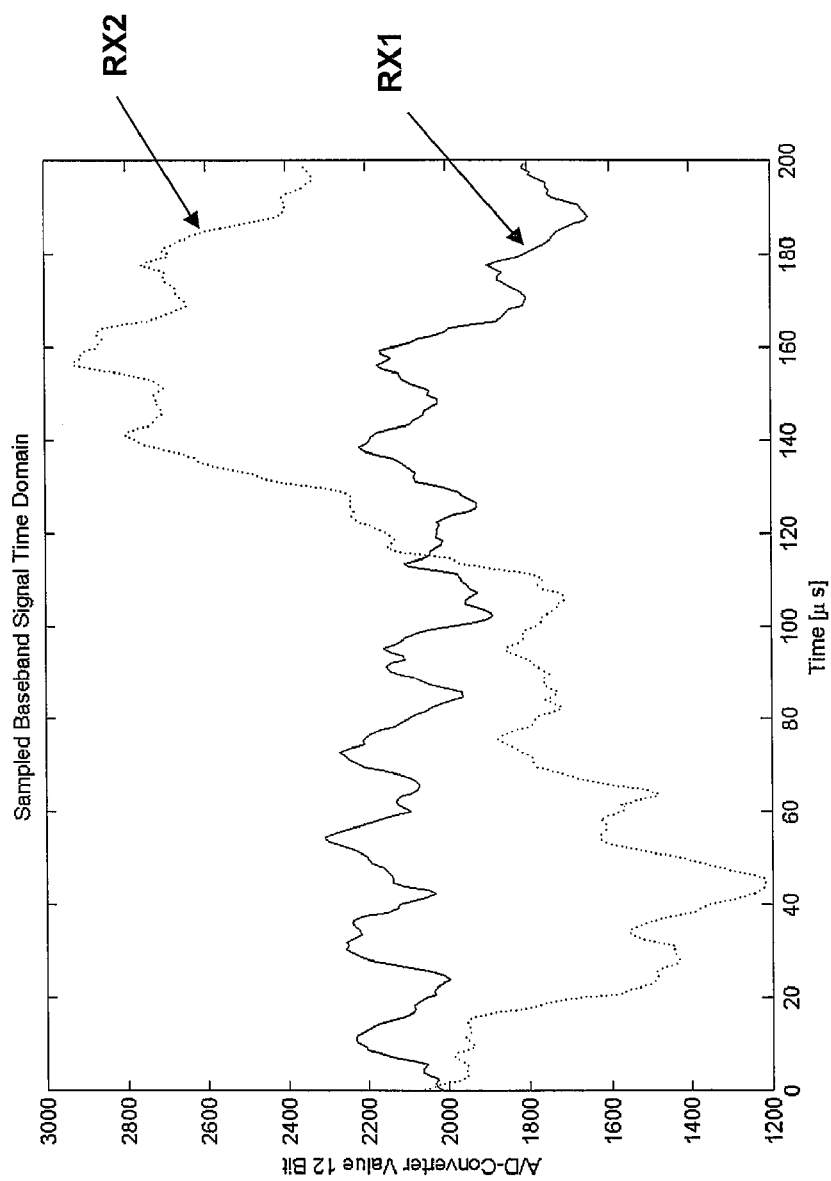
FIG. 6 illustrates sampled baseband signals produced by 12-bit A/D converters in two receiving channels for a laboratory measurement of a corner reflector.

Turning now to FIG. 6, illustrated is a graph showing sampled baseband signals produced by 12-bit A/D converters 117 and 118 for the two receiving channels, RX1 and RX2, where a corner reflector is placed in front of a sensor.

Figure 7:
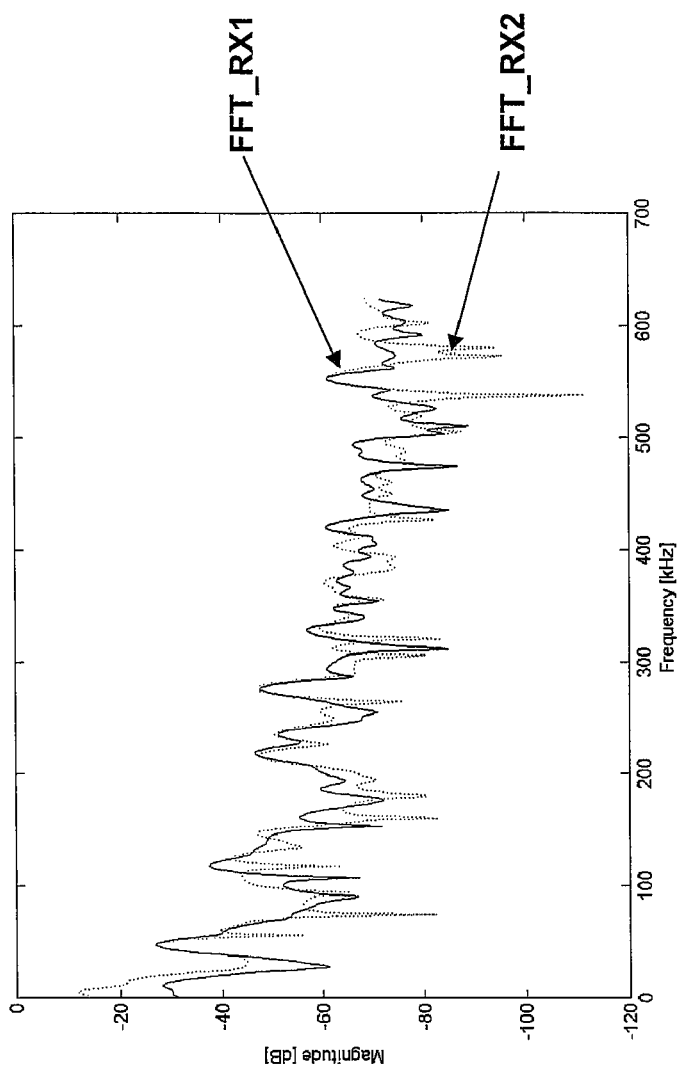
FIG. 7 illustrates a graph showing the magnitude of Fast Fourier Transforms of the sampled baseband signals illustrated in FIG. 6.

Turning now to FIG. 7, illustrated is a graph showing the magnitude of the FFTs ("Fast Fourier Transforms"), FFT_RX1 and FFT_RX2, of the received signals, illustrated in FIG. 6.

Figure 8:
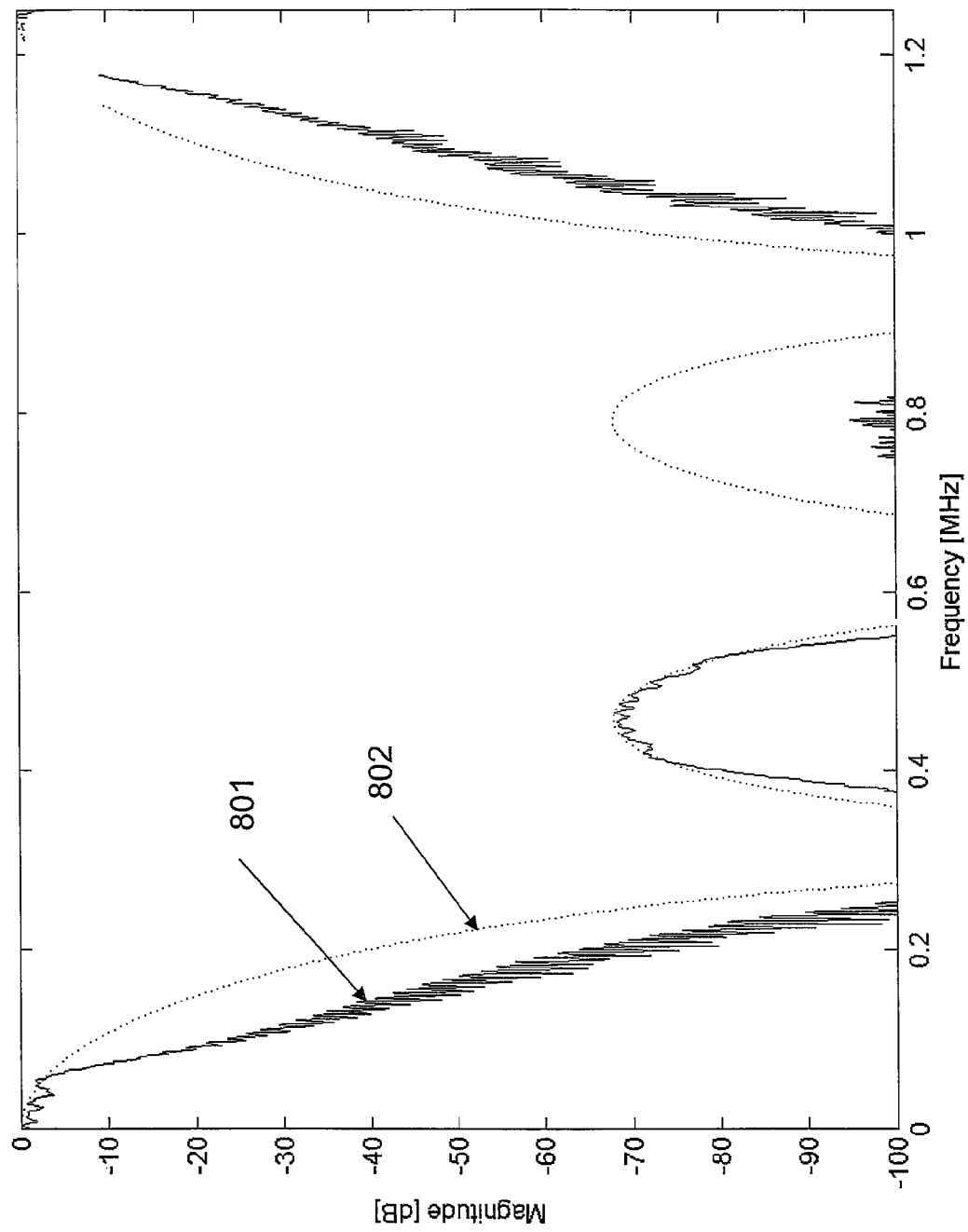
FIG. 8 illustrates a graph showing a Fast Fourier Transform of the undersampled down-converted VCO output signal of FIG. 5 after shifting the wanted frequency band to baseband and filtering with a finite-impulse response filter.

Turning now to FIG. 8, illustrated is a graph showing an FFT, 801, of the down-converted VCO output signal of FIG. 5 after shifting the wanted frequency band to baseband with the transfer function $\exp(-j2\pi f_c \cdot T_a \cdot n)$ in block 202 and filtering with the FIR filter in block 204. Additionally, the transfer function 802 of the FIR filter is shown.

Figure 9:
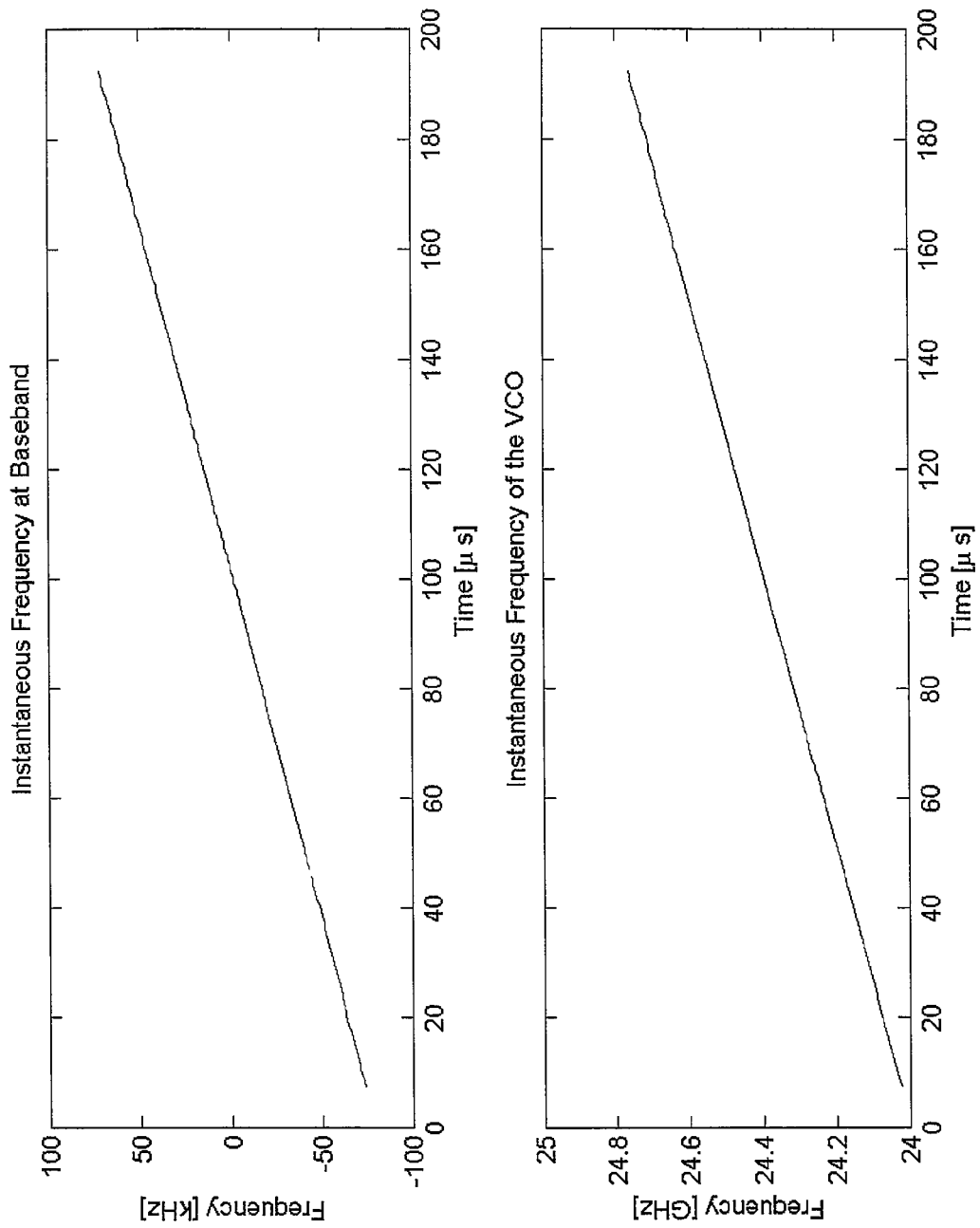
FIG. 9 illustrates in the upper graph the measured frequency of the undersampled down-converted VCO output signal of FIG. 5, and in the lower graph, the corresponding real VCO frequency.

Turning now to FIG. 9, illustrated in the upper graph is the measured frequency of the divided and undersampled VCO signal, and in the lower graph, the real VCO frequency starting from 24 GHz. The measured VCO frequency is close to an ideal linear frequency ramp. The chosen parameters in this exemplary arrangement were selected for illustrative purposes and to demonstrate process feasibility.

An FMCW radar system has thus been described, including a VCO that is controlled to produce an output frequency with a linear, periodic frequency ramp. In accordance with one exemplary embodiment of the invention, the FMCW radar system includes a frequency divider coupled to an output of the VCO to produce a frequency-divided VCO output signal. An A/D converter is coupled to the frequency-divided VCO output signal, and a down-converter is coupled to an output of the A/D converter to shift its frequency band to baseband frequencies. In an exemplary embodiment, the A/D converter coupled to the frequency-divided VCO output signal samples the frequency-divided VCO output signal at a rate lower than its fundamental frequency. The FMCW radar system further includes a low-pass filter coupled to an output of the down-converter, a VCO frequency estimator coupled to an output of the low-pass filter, and a D/A converter coupled to an output of the frequency estimator to produce an input signal for the VCO. In an exemplary embodiment, the low-pass filter coupled to the output of the down-converter is an FIR filter. In a further exemplary embodiment, the FMCW radar system includes a second low-pass filter coupled between the frequency divider and the A/D converter. In a further exemplary embodiment, a Δ-Σ modulator is coupled between the VCO frequency estimator and an input of the D/A converter. In an exemplary embodiment, the most significant bits of an output of the Δ-Σ modulator are added to an output of the VCO frequency estimator to produce an input signal for the D/A converter. In a further exemplary embodiment, a third low-pass filter is coupled between an output of the D/A converter to produce the input signal for the VCO. In a further exemplary embodiment, an extrapolator is coupled to the VCO frequency estimator to produce frequency estimates of start and end-point ramp frequencies of the VCO. In a further exemplary embodiment, memory is provided for storing frequency estimates produced by the VCO frequency estimator.

Another exemplary embodiment of the invention provides a method of operating an FMCW radar system. In the method, a signal is produced for a VCO having an output signal with a periodic frequency ramp and a VCO control input signal. In an exemplary embodiment, the VCO output signal is frequency-divided by a frequency-divider to produce a frequency-divided VCO output signal, and the frequency-divided VCO output signal is sampled with an A/D converter. The sampled frequency-divided VCO output signal is shifted in frequency to produce baseband signal samples, and the baseband signal samples are filtered to produce filtered baseband signal samples. Phase differences between successive filtered baseband signal samples are computed, and instantaneous frequencies of the VCO are estimated from the phase differences. A VCO control input signal for the next VCO period is produced using the estimated instantaneous frequencies of the VCO. In a further exemplary embodiment, the baseband signal samples are filtered with an FIR filter.

In an exemplary embodiment of the method, the frequency-divided VCO output signal is undersampled at a rate lower than a fundamental frequency of the frequency-divided VCO output signal.

In an exemplary embodiment of the method, the estimated instantaneous frequencies of the VCO are extrapolated to produce frequency estimates of start and end-point ramp frequencies of the VCO. In a further exemplary embodiment, the estimated instantaneous frequencies of the VCO are stored in a memory.

In a further exemplary embodiment of the method, the estimated instantaneous frequencies of the VCO are filtered with a Δ-Σ modulator to produce a dithered modulator signal. The most significant bits of the dithered modulator signal are added to the estimated instantaneous frequencies of the VCO to produce the VCO control input signal.

In a further exemplary embodiment of the method, the dithered modulator signal added to the estimated instantaneous frequencies of the VCO is converted with a D/A converter to produce the VCO control input signal. In a further exemplary embodiment, an output signal from the D/A converter is filtered to produce the input signal for the VCO. In a further exemplary embodiment, the A/D converter is coupled to a multiplexer to convert another signal in the FMCW radar system.

Although a linear frequency-controlled VCO has been described for application to an FMCW radar system, it should be understood that other applications of linear frequency control of a VCO are contemplated within the broad scope of the invention, and need not be limited to FMCW radar systems.

Although the invention has been shown and described primarily in connection with specific exemplary embodiments, it should be understood by those skilled in the art that diverse changes in the configuration and the details thereof can be made without departing from the essence and scope of the invention as defined by the claims below. The scope of the invention is therefore determined by the appended claims, and the intention is for all alterations that lie within the range of the meaning and the range of equivalence of the claims to be encompassed by the claims.

What is claimed is:

1. A frequency modulated continuous wave ("FMCW") radar system, comprising:
   a voltage controlled oscillator ("VCO");

a frequency divider coupled to an output of said VCO to produce a frequency-divided VCO output signal;
an analog-to-digital ("A/D") converter coupled to said frequency-divided VCO output signal;
a down-converter coupled to an output of said A/D converter to shift a frequency band thereof to baseband frequencies;
a low-pass filter coupled to an output of said down-converter;
a VCO frequency estimator coupled to an output of said low-pass filter; and
a digital-to-analog ("D/A") converter coupled to an output of said frequency estimator to produce an input signal for said VCO.

2. The FMCW radar system as claimed in claim 1, wherein said low-pass filter coupled to said output of said down-converter comprises an FIR filter.

3. The FMCW radar system as claimed in claim 1, further comprising a second low-pass filter coupled between said frequency divider and said A/D converter.

4. The FMCW radar system as claimed in claim 1, wherein said A/D converter coupled to said frequency-divided VCO output signal samples said frequency-divided VCO output signal at a rate lower than a fundamental frequency thereof.

5. The FMCW radar system as claimed in claim 1, further including a delta-sigma ("Δ-Σ") modulator coupled between said VCO frequency estimator and an input of said D/A converter.

6. The FMCW radar system as claimed in claim 5, wherein at least one most significant bit ("MSB") of an output of said Δ-Σ modulator is added to an output of said VCO frequency estimator to produce an input signal for said D/A converter.

7. The FMCW radar system as claimed in claim 1, further comprising a third low-pass filter coupled between an output of said D/A converter to produce said input signal for said VCO.

8. The FMCW radar system as claimed in claim 1, further including an extrapolator coupled to said VCO frequency estimator to produce frequency estimates of start and end-point ramp frequencies of said VCO.

9. The FMCW radar system as claimed in claim 8, further including memory for storing frequency estimates produced by said VCO frequency estimator.

10. The FMCW radar system as claimed in claim 1, wherein said A/D converter is coupled to a multiplexer to convert another signal in said FMCW radar system.

11. A method of operating a frequency modulated continuous wave ("FMCW") radar system, the method comprising:
producing a signal with a periodic frequency ramp;
frequency-dividing said signal with a periodic frequency ramp by a frequency-dividing factor to produce a frequency-divided signal;
sampling said frequency-divided signal;
shifting said sampled frequency-divided signal to produce baseband signal samples;
filtering said baseband signal samples to produce filtered baseband signal samples;
computing phase differences between successive filtered baseband signal samples;
estimating instantaneous frequencies of said signal produced with said periodic frequency ramp from said phase differences; and
producing a control input signal for said next period using said estimated instantaneous frequencies of said signal produced with said periodic frequency ramp.

12. The method as in claim 11, wherein said baseband signal samples are filtered with an FIR filter.

13. The method as in claim 11, wherein said frequency-divided signal is undersampled at a rate lower than a fundamental frequency of said frequency-divided signal.

14. The method as in claim 11, further including extrapolating said estimated instantaneous frequencies of said signal produced with a periodic frequency ramp to produce frequency estimates of start and end-point ramp frequencies of said signal produced with a periodic frequency ramp.

15. The method as in claim 14, further including storing in a memory said estimated instantaneous frequencies of said signal produced with a periodic frequency ramp.

16. The method as in claim 11, further including filtering said estimated instantaneous frequencies of said signal produced with a periodic frequency ramp with a Δ-Σ modulator to produce a dithered modulator signal.

17. The method as in claim 16, wherein at least one most significant bit ("MSB") of said dithered modulator signal is added to said estimated instantaneous frequencies of said signal produced with a periodic frequency ramp to produce said control input signal.

18. The method as in claim 16, further including converting with a D/A converter said dithered modulator signal added to said estimated instantaneous frequencies of said signal produced with said periodic frequency ramp to produce said control input signal.

19. The method as in claim 18, further including filtering an output signal from said D/A converter to produce said control input signal.

20. A frequency modulated continuous wave ("FMCW") radar system, comprising:
a voltage controlled oscillator ("VCO");
a frequency divider coupled to an output of said VCO to produce a frequency-divided VCO output signal;
a first low-pass filter coupled to said frequency-divided VCO output signal;
an analog-to-digital ("A/D") converter coupled to an output of said first low-pass filter;
a down-converter coupled to an output of said A/D converter to shift a frequency band thereof to baseband frequencies;
a finite impulse response ("FIR") filter coupled to an output of said down-converter;
a VCO frequency estimator coupled to an output of said FIR filter;
a delta-sigma ("Δ-Σ") modulator coupled to an output of said VCO frequency estimator;
a digital-to-analog ("D/A") converter coupled to an output of said Δ-Σ modulator; and
a second low-pass filter coupled to an output of said D/A converter to produce an input signal for said VCO.

21. A radar system, comprising:
means for generating a signal with a variable frequency;
means for producing a frequency-divided signal from said signal with a variable frequency;
means for filtering said frequency-divided signal;
means for converting said filtered frequency-divided signal into a digital form;
means for shifting a frequency band of said filtered and converted frequency-divided signal to baseband frequencies;
means for filtering said filtered and shifted frequency-divided signal;
means for estimating frequencies of said filtered, shifted, and filtered frequency-divided signal;
means for dithering said estimated frequencies;
means for converting said dithered estimated frequencies to analog form; and means for filtering said dithered and converted estimated frequencies to produce a control signal for said means for generating a signal with a variable frequency.

22. The radar system as claimed in claim 21, further comprising means for transmitting the signal with the variable frequency.

23. The FMCW radar system as claimed in claim 1, wherein the VCO is configured to be coupled to a transmitter of the FMCW radar system.

24. The FMCW radar system as claimed in claim 23, further comprising the transmitter of the FMCW radar system.

25. The FMCW radar system as claimed in claim 10, wherein said another signal in said FMCW radar system comprises an output of a radar receiving channel.

26. The method of claim 11, further comprising coupling the signal to a transmitter of the FMCW radar system.

27. The FMCW radar system as claimed in claim 20, wherein the VCO is configured to be coupled to a transmitter of the FMCW radar system.

28. The FMCW radar system as claimed in claim 27, further comprising the transmitter of the FMCW radar system.

* * * * *